United States Patent
Kim et al.

(10) Patent No.: US 12,490,641 B2
(45) Date of Patent: Dec. 2, 2025

(54) DISPLAY DEVICE INCLUDING SUBSTRATE INCLUDING PATTERNS AND PATTERNING METHOD OF SUBSTRATE

(71) Applicant: Samsung Display Co., LTD., Yongin-si (KR)

(72) Inventors: Yu Ri Kim, Guri-si (KR); Kyung-Man Kim, Anyang-si (KR); Da Woon Kim, Yongin-si (KR); Sang Hoon Kim, Hwaseong-si (KR); Sung Hoon Kim, Asan-si (KR); Seung Ho Kim, Asan-si (KR); Min-Hoon Choi, Seoul (KR); Seong Jin Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 616 days.

(21) Appl. No.: 17/894,574

(22) Filed: Aug. 24, 2022

(65) Prior Publication Data
US 2023/0069383 A1  Mar. 2, 2023

(30) Foreign Application Priority Data
Aug. 24, 2021 (KR) .................. 10-2021-0111596

(51) Int. Cl.
*H10K 71/20* (2023.01)
*H10K 50/84* (2023.01)
*H10K 102/00* (2023.01)

(52) U.S. Cl.
CPC .......... *H10K 71/231* (2023.02); *H10K 50/84* (2023.02); *H10K 2102/311* (2023.02)

(58) Field of Classification Search
CPC ................ H10K 71/231; H10K 50/84; H10K 2102/311; H10K 59/10; H10K 77/111; Y02E 10/549
See application file for complete search history.

(56) References Cited

U.S. PATENT DOCUMENTS

| | | | |
|---|---|---|---|
| 9,012,305 B1 * | 4/2015 | Lei | H01L 21/31105 257/E21.602 |
| 9,196,536 B1 * | 11/2015 | Park | H01L 21/67115 |
| 9,656,910 B2 | 5/2017 | Bazemore et al. | |
| 2006/0249873 A1 * | 11/2006 | Smith | B81C 1/00357 257/E21.233 |

(Continued)

FOREIGN PATENT DOCUMENTS

| | | |
|---|---|---|
| CN | 104393116 | 3/2015 |
| JP | 2005108965 | 4/2005 |
| KR | 1020160014571 | 2/2016 |

(Continued)

*Primary Examiner* — J. E. Schoenholtz
(74) *Attorney, Agent, or Firm* — CANTOR COLBURN LLP

(57) ABSTRACT

A display device includes a substrate including a first surface from which a pattern including an end portion is defined and a second surface which is parallel to the first surface. When an inner radius from a reference line positioned above the end portion and parallel with the first surface of the substrate to a surface of the pattern defining about 90 degrees is referred to as a first inner radius and an inner radius from the reference line to the surface of the pattern defining about 45 degrees is a second inner radius, a ratio of the second inner radius to the first inner radius is about 0.7 or more.

16 Claims, 20 Drawing Sheets

(56) References Cited

U.S. PATENT DOCUMENTS

2013/0052414 A1\* 2/2013 Dobbins ............... C03B 17/065
                                                                                                    65/44
2016/0115069 A1\* 4/2016 Abramov ................ C03B 33/03
                                                                                                   65/162

FOREIGN PATENT DOCUMENTS

| KR | 1020160029097 | | 3/2016 |
| --- | --- | --- | --- |
| KR | 101684344 | | 12/2016 |
| KR | 20170001218 | A | 1/2017 |

\* cited by examiner

DISPLAY DEVICE INCLUDING SUBSTRATE INCLUDING PATTERNS AND PATTERNING METHOD OF SUBSTRATE

This application claims priority to Korean Patent Application No. 10-2021-0111596, filed on Aug. 24, 2021, and all the benefits accruing therefrom under 35 U.S.C. § 119, the content of which in its entirety is herein incorporated by reference.

BACKGROUND

(a) Field

Embodiments of the invention relate to a display device including a substrate with a pattern and a patterning method of a substrate.

(b) Description of the Related Art

A display device such as an organic light-emitting diode display or a liquid crystal display includes various substrates. A cover window covering a panel on which an electronic element is formed may include a substrate made of a material such as plastic or glass.

Recently, a flexible display panel in which at least a portion of the display panel may be deformed and a flexible display device including the same are being developed. The flexible display device may be classified into a bendable display device, a foldable display device that can be folded and unfolded, a rollable display device, a stretchable display device, and the like depending on its usage and form.

A glass substrate is more resistant to dents and scratches due to external impact than a plastic film substrate, but a glass substrate having a predetermined thickness or more is desired to prevent breakage in a deformable portion of the flexible display device and to increase impact resistance and durability.

SUMMARY

A pattern may be defined in the substrate in order to increase flexibility of a deformable portion of a substrate used in a flexible display device.

The embodiments are intended to prevent a decrease in flexural strength due to an unintended shape, and eventually increase flexural strength of the substrate by precisely defining a shape of this pattern as designed, that is, by controlling a thickness and shape of the pattern to be defined. In addition, it is to control the shape and at the same time simplify a patterning process and reduce a time of the patterning process. An embodiment of the invention provides a display device including a substrate which includes a first surface from which a pattern including an end portion is defined and a second surface which is parallel to the first surface. When an inner radius from a reference line positioned above the end portion and parallel with the first surface of the substrate to a surface of the pattern defining about 90 degrees is referred to as a first inner radius and an inner radius from the reference line to the surface of the pattern defining about 45 degrees is a second inner radius, a ratio of the second inner radius to the first inner radius is about 0.7 or more.

In an embodiment, the display device may be flexible, and a plurality of patterns may be defined in a portion of the substrate that is deformed when the display device is deformed.

In an embodiment, a distance between an end portion of the plurality of patterns and the second surface may be greater than zero.

In an embodiment, the substrate may include glass, and a thickness of the substrate may be about 100 micrometers (μm) or more.

An embodiment of the invention provides a patterning method including forming a reformed region on a substrate by irradiating a laser on a first surface of the substrate, defining a first pattern corresponding to the reformed region by first etching the substrate, and defining a second pattern that is further etched from the first pattern by second etching the substrate, where the first etching is performed by an alkali-based etchant and the second etching is performed by an acid-based etchant.

In an embodiment, a chemical characteristic of the substrate may be changed and no physical damage may occur in the reformed region.

In an embodiment, the alkali-based etchant may include sodium hydroxide or potassium hydroxide, and the acid-based etchant may include hydrofluoric acid.

In an embodiment, when a ratio of a thickness that is etched from a side of the first surface of the substrate in a region where the first pattern is defined to a thickness that is etched from a side of the first surface of the substrate in a region where the first pattern is not defined is referred to as first selectivity in the first etching, and a ratio of a thickness that is etched from a side of the first surface of the substrate in a region where the second pattern is defined to a thickness that is etched from a side of the first surface of the substrate in a region where the second pattern is not defined is referred to as second selectivity in the second etching, the second selectivity may be smaller than the first selectivity.

In an embodiment, a depth of the first pattern may be longer than a width of the first pattern at an entrance side of the first pattern.

In an embodiment, a ratio of the depth to the width of the first pattern at the entrance side of the first pattern may be greater than a ratio of a depth to a width of the second pattern at an entrance side of the second pattern.

In an embodiment, the width of the second pattern at the entrance side of the second pattern may gradually increase with a time during which the second etching is performed, and the ratio of the depth of the second pattern to the width of the second pattern at the entrance side of the second pattern may gradually decrease.

In an embodiment, the second pattern may include an end portion, and when an inner radius from a reference line positioned above the end portion and parallel with the first surface of the substrate to a surface of the second pattern defining about 90 degrees is also referred to as a first inner radius and an inner radius from the reference line to the surface of the second pattern defining about 45 degrees is a second inner radius, a ratio of the second inner radius to the first inner radius increases as an etching amount of the second etching may increase.

In an embodiment, a roughness of an upper surface of the second pattern may be greater than a roughness of an upper surface of the first pattern.

In an embodiment, a bending strength of the substrate including the second pattern may be greater than a bending strength of the substrate including the first pattern.

An embodiment of the invention provides a patterning method including forming a reformed region on a substrate by irradiating a laser on a first surface of the substrate; defining a first pattern corresponding to the reformed region by first etching the substrate; and defining a second pattern that is further etched from the first pattern by second etching the substrate, where the second etching is more isotropic than the first etching.

In an embodiment, a chemical characteristic of the substrate may be changed and no physical damage may occur in the reformed region.

In an embodiment, the first etching may be performed by an alkali-based etchant, and the second etching may be performed by an acid-based etchant.

In an embodiment, when a ratio of a thickness that is etched from a side of the first surface of the substrate in a region where the first pattern is defined to a thickness that is etched from a side of the first surface of the substrate in a region where the first pattern is not defined is referred to as first selectivity in the first etching, and a ratio of a thickness that is etched from a side of the first surface of the substrate in a region where the second pattern is defined to a thickness that is etched from a side of the first surface of the substrate in a region where the second pattern is not defined is referred to as second selectivity in the second etching, the second selectivity may be smaller than the first selectivity.

In an embodiment, a depth of the first pattern may be longer than a width of the first pattern at an entrance side of the first pattern.

In an embodiment, a ratio of the depth to the width of the first pattern at the entrance side of the first pattern may be greater than a ratio of a depth to a width of the second pattern at an entrance side of the second pattern.

By the embodiments, it is possible to increase bending strength of the substrate by precisely defining the shape of the pattern defined in the substrate of the flexible display device as designed, and it is possible to simplify a patterning process and reduce a process time while controlling a thickness and shape of the pattern.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
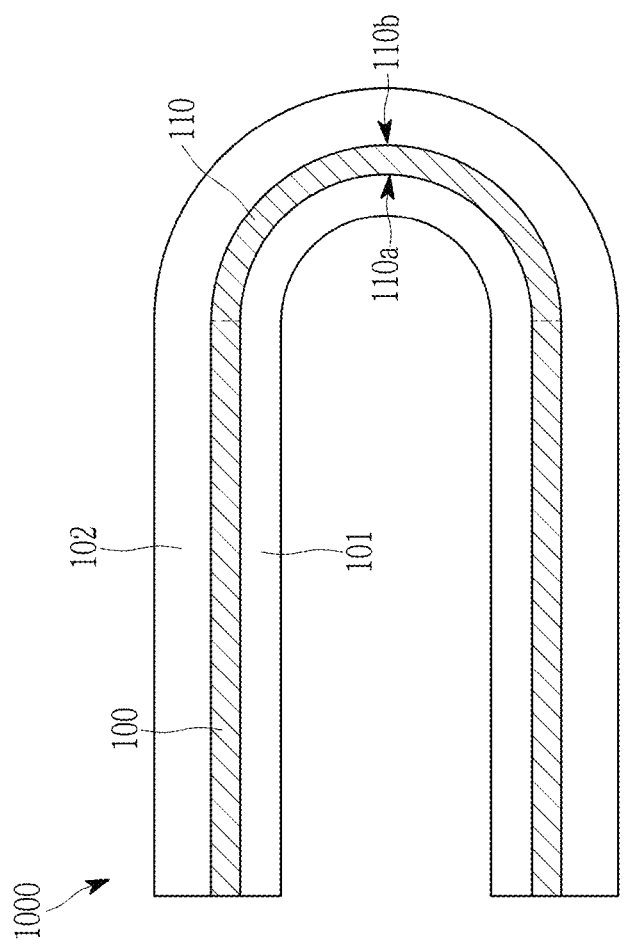
FIG. 1 illustrates a schematic cross-sectional view of an embodiment of a display device, FIG. 2 and FIG. 3 each illustrate a cross-sectional view of an embodiment of a pattern to be defined in a substrate of a display device, FIG. 4 and FIG. 5 each illustrate an embodiment of an operation of irradiating a laser onto a substrate as an operation of a process of a method for patterning a substrate of a display device.

The invention will be described more fully hereinafter with reference to the accompanying drawings, in which embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

In addition, in the specification, "connected" means that two or more components are not only directly connected, but two or more components may be connected indirectly through other components, physically connected as well as being electrically connected, or it may be referred to be different names depending on the location or function, but may include connecting each of parts that are substantially integral to each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

First, a display device in an embodiment will be described with reference to FIG. 1 to FIG. 3.

A display device in an embodiment will now be described with reference to FIG. 1.

FIG. 1 illustrates a schematic cross-sectional view of an embodiment of a display device.

A display device 1000 in an embodiment may be, for example, a flexible display device such as a foldable display device.

The display device 1000 includes a substrate 100 including a first surface 110a and a second surface 110b. The display device 1000 may further include a first portion 101 disposed on the first surface 110a of the substrate 100 and a second portion 102 disposed on the second surface 110b of the substrate 100.

The substrate 100 may be disposed at various portions on the cross-section of the display device 1000, and in an embodiment, the substrate 100 may form a cover window, for example.

When the display device 1000 displays an image toward the first surface 110a, the second portion 102 may include a display panel capable of displaying an image, and the first portion 101 may include a protective film.

Conversely, when the display device 1000 displays an image toward the second surface 110b, the first portion 101 may include a display panel capable of displaying an image, and the second portion 102 may include a protective film.

When the display device 1000 is a foldable display device, a display surface of the display panel may not be exposed when the display device is folded, but the display surface may be exposed when the display device is unfolded, and conversely, the display surface may be exposed to the outside when the display device is folded, and the display surface may be exposed even when the display device is unfolded.

The substrate 100 may include glass. In an embodiment, the thickness of the substrate 100 may be about 100 micrometers (μm) or more.

The substrate 100 may include a deformable portion 110 that deforms when the display device 1000 is folded and unfolded. In the case of a foldable display device, the deformable portion 110 may be also referred to as a folding portion. A plurality of patterns is defined in the deformable portion 110 to increase flexibility.

Figure 2:
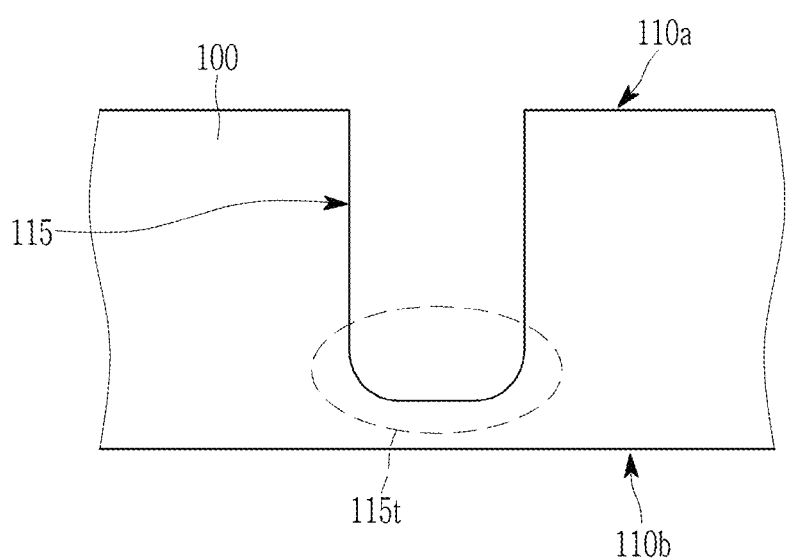
Figure 3:
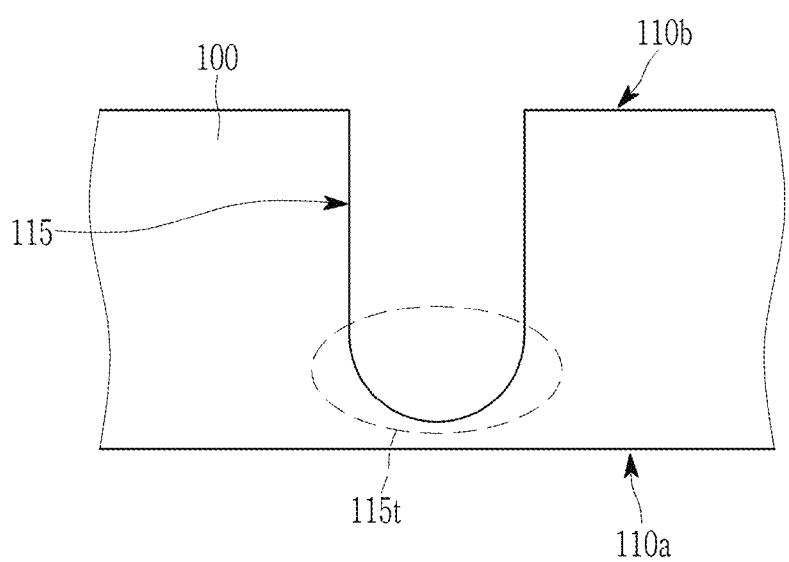

FIG. 2 and FIG. 3 each illustrate a cross-sectional view of an embodiment of a pattern 115 to be defined in a substrate of a display device. The pattern 115 may be a groove or hole defined inside the substrate from the first surface 110a or the second surface 110b of the substrate 100 by patterning the substrate 100 by etching.

Referring to FIG. 2 and FIG. 3, the pattern 115 to be defined in the substrate 100 may be defined in at least one of the first surface 110a or the second surface 110b of the substrate 100. That is, as illustrated in FIG. 2, the pattern 115 may be defined in the first surface 110a of the substrate 100, and as illustrated in FIG. 3, may be defined in the second surface 110b of the substrate 100, and may be defined in both the first surface 110a and the second surface 110b. Although only one pattern 115 is illustrated in FIG. 2 and FIG. 3, a plurality of patterns 115 may be defined in the substrate 100.

The pattern 115 may be defined such that at least a portion of the substrate 100 remains under the pattern 115 without penetrating the substrate 100. That is, an end portion 115t of the pattern 115 may not meet the opposite surface of the substrate 100. However, in another embodiment, the pattern 115 may be defined to penetrate the substrate 100.

A cross-section of the end portion 115t of the pattern 115 depending on a design thereof may form a U-shape having a substantially parallel base as illustrated in FIG. 2, or an approximately circular shape as illustrated in FIG. 3. This is to increase bending strength by preventing cracks from being generated due to stress on the end portion 115t when bending of the display device, by defining the pattern 115 to have a rounded end portion 115t while increasing flexibility by facilitating deformation of the substrate 100 by the patterns 115 when deformation such as folding and unfolding is repeated in the deformable portion 110.

Next, a method for patterning a substrate and a substrate manufactured by the method in an embodiment will be described with reference to FIG. 4 to FIG. 10 together with the drawings described above.

Figure 4:
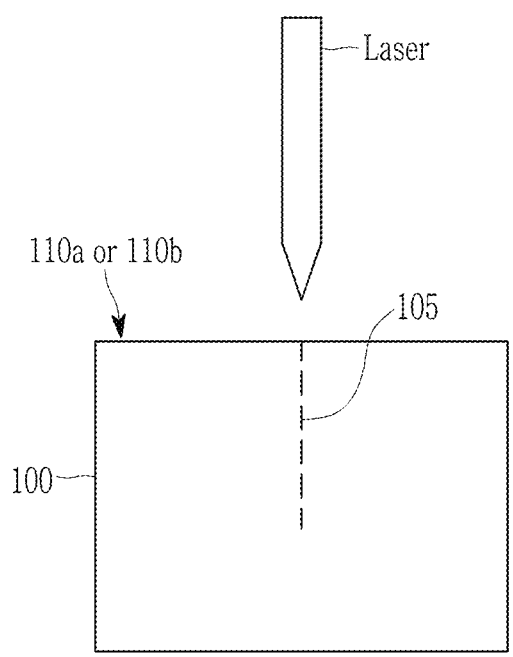
Figure 5:
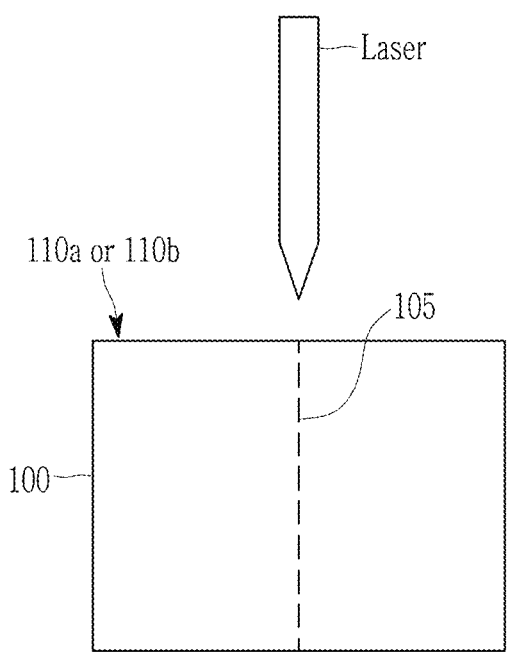
Figure 6:
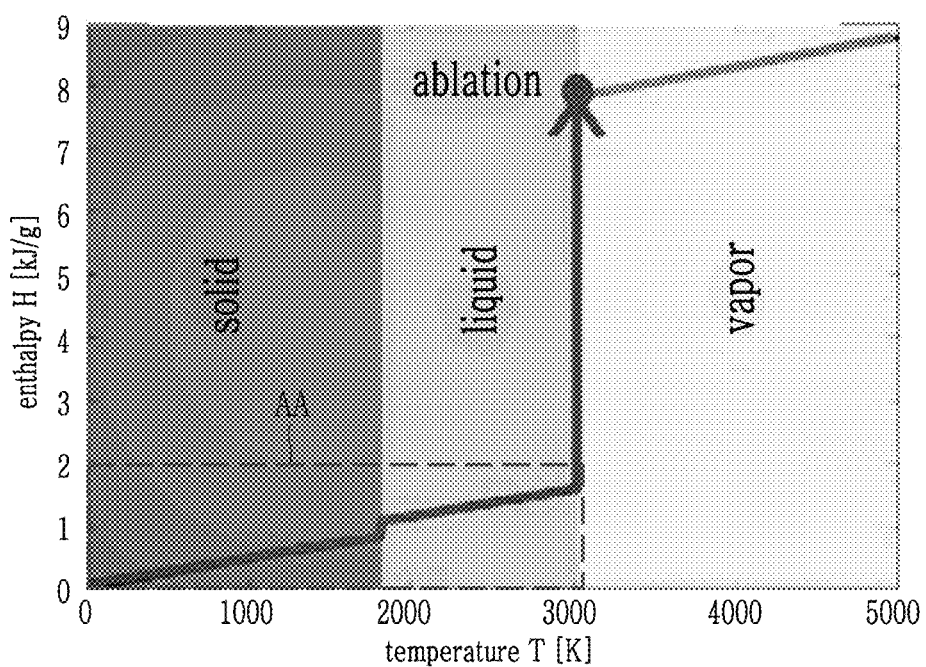
FIG. 6 illustrates an embodiment of temperature and energy ranges of a laser used in a process of a method for patterning a substrate of a display device.

FIG. 4 and FIG. 5 each illustrate an embodiment of an operation of irradiating a laser onto a substrate as an operation of a process of a method for patterning a substrate of a display device, and FIG. 6 illustrates temperature and energy ranges of a laser used in an embodiment of a process of a method for patterning a substrate of a display device.

A method of patterning a substrate of a display device in an embodiment includes forming a reformed region 105 by irradiating a laser to a region of the substrate 100 (refer to FIGS. 1 to 3) corresponding to the pattern 115 to be defined.

Referring to FIG. 4 and FIG. 5, the reformed region 105 is formed or provided by irradiating a laser from the first surface 110a or the second surface 110b of the substrate 100 to change reforming of the substrate 100 at a side of an irradiated surface.

In the reformed region 105, a chemical characteristic of the substrate 100 may be changed by the laser. However, physical damage such as a groove or cutting of the substrate 100 by laser irradiation does not occur. For a laser for this purpose, power, an irradiation pitch, a time, etc., of the laser may be adjusted such that a range of enthalpy or temperature of the laser becomes a range in which a phase of a substrate material maintains a solid or liquid form as in a region indicated by AA in FIG. 6.

Referring back to FIG. 4 and FIG. 5, the reformed region 105 of the substrate 100 having a characteristic that is changed by laser irradiation corresponds to the pattern 115 to be defined as illustrated in FIG. 2 or FIG. 3 described above. The reformed region 105 may be a partial region in a thickness direction of the substrate 100 as illustrated in FIG. 4, or may be an entire region in the thickness direction of the substrate 100 as illustrated in FIG. 5.

As such, the reformed region 105 of the substrate 100 having a characteristic that is changed by laser irradiation may be preferentially etched over other regions in a subsequent etching process. Such an etching process will be described with reference to FIG. 7 to FIG. 10.

Figure 7:
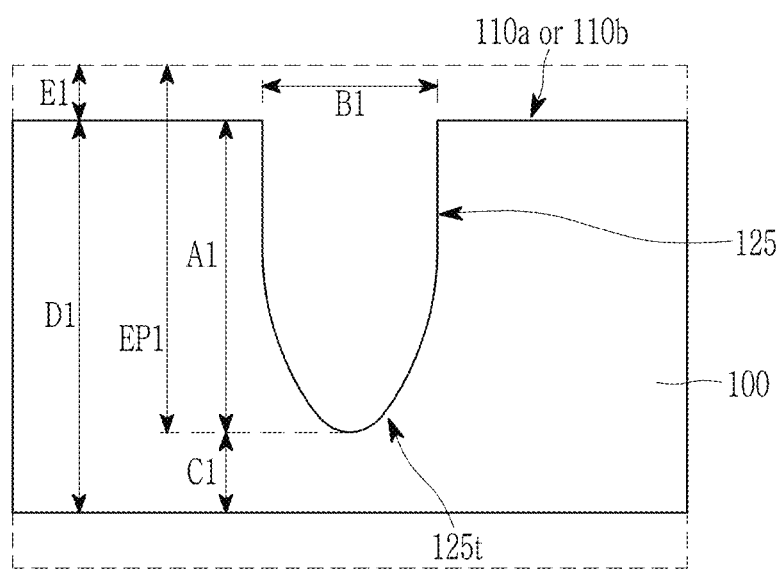
FIG. 7 illustrates a cross-sectional view of an embodiment of a substrate formed or provided in an operation of a process of a method for patterning a substrate of a display device.
Figure 8:
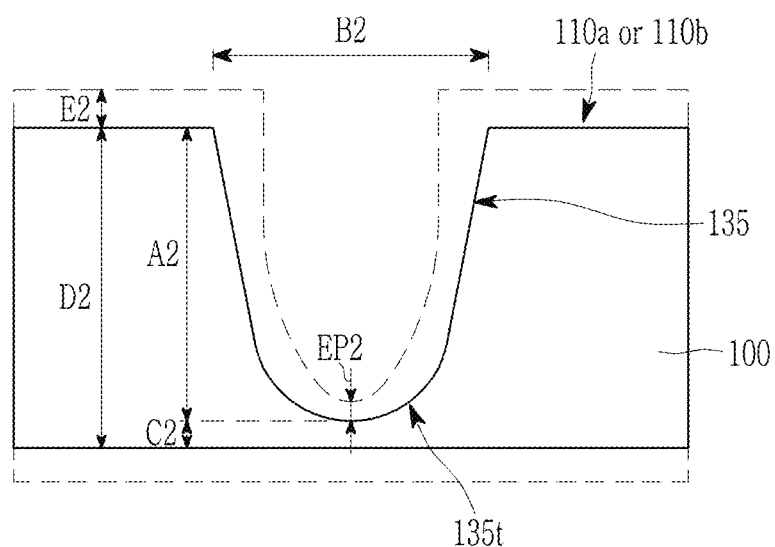
FIG. 8 illustrates a cross-sectional view of an embodiment of a substrate formed or provided in an operation subsequent to the operation illustrated in FIG. 7.
Figure 9:
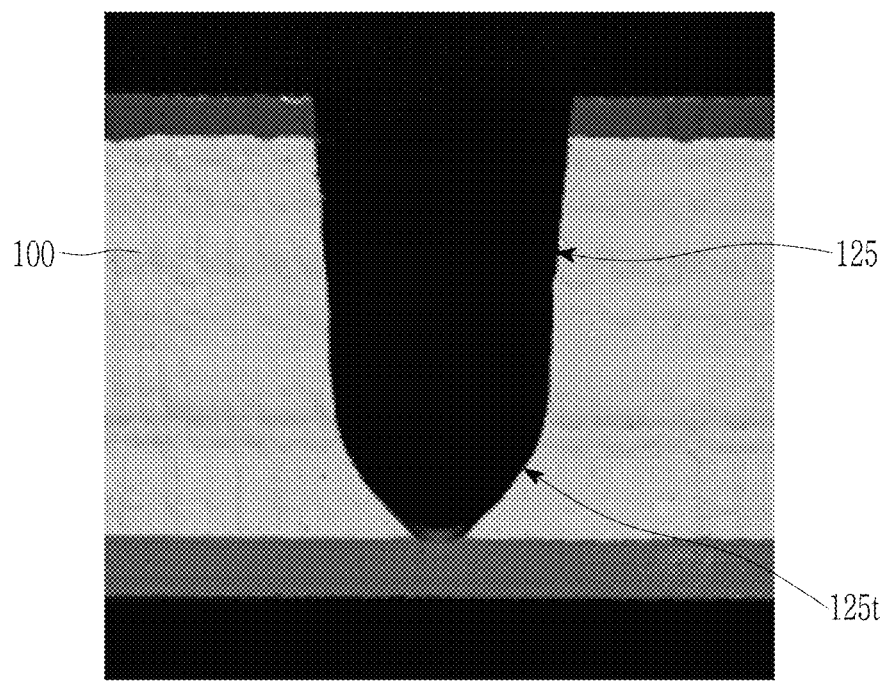
FIG. 9 illustrates a photograph showing a cross-section of an embodiment of the substrate illustrated in FIG. 7.
Figure 10:
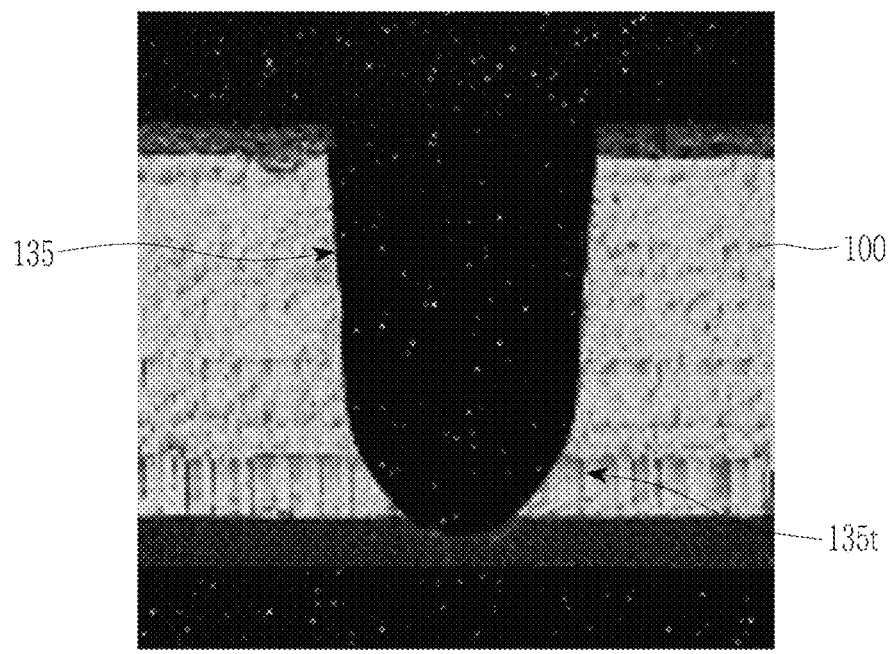
FIG. 10 illustrates a photograph showing a cross-section of the embodiment of the substrate illustrated in FIG. 8.

FIG. 7 illustrates a cross-sectional view of an embodiment of a substrate formed or provided in an operation of a process of a method for patterning a substrate of a display device, FIG. 8 illustrates a cross-sectional view of an embodiment of a substrate formed or provided in an operation subsequent to the operation illustrated in FIG. 7, FIG. 9 illustrates a photograph showing a cross-section of an embodiment of the substrate according to the embodiment illustrated in FIG. 7, and FIG. 10 illustrates a photograph showing a cross-section of the embodiment of the substrate illustrated in FIG. 8.

A method of patterning a substrate of a display device in an embodiment includes a first etching process and a second etching process that are subsequently performed in addition to the laser irradiation process described above.

In the first etching process, an alkaline etching solution such as a sodium hydroxide (NaOH) or a potassium hydroxide (KOH) is used, and in the second etching process, an acidic etching solution such as a hydrofluoric acid, a sulfuric acid, a nitric acid, or a hydrochloric acid is used. Accordingly, relatively more anisotropic etching is performed in the first etching process, and relatively more isotropic etching is performed in the second etching process.

In the first etching process and the second etching process, an etchant may be sprayed onto the substrate 100 or the substrate 100 may be immersed in the etchant.

Referring to FIG. 7, the substrate 100 before the first etching process is a portion indicated by a dotted line, the substrate 100 after the first etching process is indicated by a solid line, and a pattern 125 after the first etching process is defined. The pattern 125 is defined to be elongated in a thickness direction of the substrate 100.

A first etch selectivity (EP1/E1) of the reformed region 105 depending on laser irradiation is significantly greater than that of other regions when a first etching thickness E1 of the substrate 100 in a portion where the pattern 125 is not defined and a first etching thickness EP1 of the substrate 100 in a portion where the pattern 125 is defined as the reformed region 105 are compared based on one surface in which the pattern 125 is defined in the substrate 100.

In an embodiment, when the thickness of the substrate 100 before the first etching process is about 300 μm and a thickness D1 of the substrate 100 in the portion without the pattern after the first etching is about 197 μm, the first etch thickness E1 of the non-patterned portion is about 51.5 μm, and the first etched thickness EP1 of the patterned portion may be about 227.5 μm, and in this case, the first etch selectivity (EP1/E1) of a portion of the pattern 125 may be about 4.4, for example.

For a shape of the pattern 125 defined by the first etching process, more etching is performed in a direction of a depth A1 of the pattern 125 in a thickness direction (e.g., vertical direction in FIG. 7) than that in a direction (e.g., horizontal direction in FIG. 7) of a width B1 thereof when the depth A1 is compared with the width B1 at an entrance. That is, the first etching process is anisotropic etching in which more etching is performed in a depth direction of a pattern than in a width direction thereof.

In an embodiment, when the thickness of the substrate 100 before the first etching process is about 300 μm, the depth A1 of the pattern 125 is about 176 μm, and the width B1 at the entrance side may be about 100 μm, and in this case, A1/B1 may be about 1.76, for example. In this case, a distance from an end portion 125t of the pattern 125 to a surface of the substrate 100 which it faces, that is, a remaining thickness C1 of the substrate 100 in the pattern portion, may be about 21 μm.

Next, referring to FIG. 8, the substrate 100 before the second etching process after the first etching process is a portion indicated by a dotted line, the substrate 100 after the second etching process is indicated by a solid line, and a pattern 135 after the second etching process is defined.

The pattern 135 may be a groove or hole defined inside the substrate from the first surface 110a or the second surface 110b of the substrate 100.

A second etch selectivity (EP2/E2) is smaller than the first etch selectivity (EP1/E1) when a second etching thickness E2 of the substrate 100 in the portion without the pattern 135 after the first etching process and a second etching thickness EP2 of the substrate 100 in the portion where the pattern 135 is defined are compared based on one surface where the pattern 135 is defined.

In an embodiment, when the thickness D1 of the substrate 100 after the first etching process is about 197 μm and a thickness D2 of the substrate 100 after the second etching process is about 187 μm, the second etch thickness E2 of the non-patterned portion is about 5 μm, and the second etched thickness EP2 of the patterned portion may be about 5 μm, and in this case, the second etch selectivity (EP2/E2) of a portion of the pattern 135 may be about 1, for example.

For a shape of the pattern 135 defined by the second etching process, a ratio of the depth A2 of the pattern 135 in a thickness direction to the width B2 of the pattern 135 at the entrance side is smaller than the ratio of the depth A1 of the pattern 125 in the thickness direction to the width B1 of the pattern 125 at the entrance side immediately after the first etching process. That is, the second etching process is more isotropic than the first etching process because the second etch process is etched to a similar extent to the depth and width of the pattern compared to the first etch process.

In an embodiment, when the thickness of the substrate 100 before the second etching process is about 197 μm, the depth A2 of the pattern 135 is about 176 μm as before the second etching process, and the width B2 at the entrance side is wider than before the second etching process and may be about 110 μm, and in this case, A2/B2 may be about 1.6, for example. In this case, a distance from an end portion 135t of the pattern 135 to a surface of the substrate 100 which it faces, that is, a remaining thickness C2 of the substrate 100 in the pattern portion may be about 11 μm.

A remaining thickness C2 of the substrate 100, which is a distance between the end portion 135t of the pattern 135 and the surface 110b or 110a of the substrate 100 adjacent thereto, may be greater than zero. However, when the pattern 135 penetrates the substrate 100, the thickness C2 may be zero.

When the shape of the pattern 125 immediately after the first etching process is compared with the shape of the pattern 135 immediately after the second etching process, the pattern 125 has a longer shape in the thickness direction of the substrate 100 than that of the pattern 135, and the end portion 125t of the pattern 125 has a sharper shape than the previously designed shape illustrated in FIG. 2 or FIG. 3.

However, after the second etching process, the pattern 135 has a wider width than that of the pattern 125, and the shape of the end portion 135t has a less sharp and round shape than that of the end portion 125t, and is similar to the designed shape illustrated in FIG. 2 or FIG. 3.

Referring to FIG. 9, which is an actual photograph of the pattern 125 defined immediately after this first etching process, the pattern 125 has an elongated shape in the thickness direction of the substrate 100 by a region having a large etch selectivity depending on laser irradiation and the end portion 125t of the pattern 125 has a relatively sharp shape. However, referring to FIG. 10, which is an actual photograph of the pattern 135 defined immediately after the second etching process, after the second etching process, the pattern 135 has a wider width than that of the pattern 125 and the shape of the end portion 135t has a less sharp and round shape than that of the end portion 125t, and is similar to the designed shape illustrated in FIG. 2 or FIG. 3. That is, the pattern 135 may be precisely defined as designed, and it is possible to control a shape of a pattern defined through the anisotropic and isotropic etching process after the modification of the substrate by laser irradiation and the remaining thickness of the substrate. Accordingly, it is possible to define a pattern having the rounded end portion 135t as designed instead of the sharp end portion as illustrated in FIG. 7 or FIG. 9, thereby increasing the bending strength of the substrate 100.

It is possible to control a time of the entire process, a shape of the final pattern, or the like by adjusting the times of the first etching process and the second etching process. In the case of the photographs show in FIG. 9 and FIG. 10, the patterns 125 and 135 are shown in which the first etching is performed for about 2 hours (h) and the second etching is performed for about 5 minutes (min). As the time of the second etching process, which is isotropic etching, increases, a width of the finally defined pattern 135 may become larger and may have a more round shape. This will be described with reference to FIG. 11 to FIG. 17.

Figure 11:
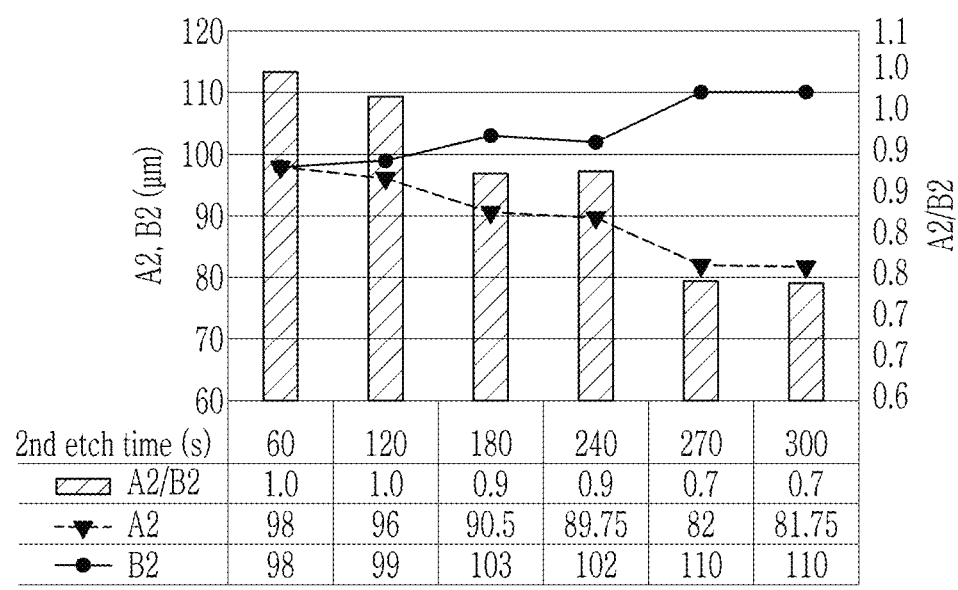
FIG. 11 illustrates a graph showing an embodiment of a dimension and a dimension ratio of a pattern depending on an etching time in a second etching operation during a process of a method for patterning a substrate of a display device.

FIG. 11 illustrates a graph showing an embodiment of a dimension and a dimension ratio of a pattern depending on an etching time in a second etching step during a process of a method for patterning a substrate of a display device.

Referring to FIG. 11, for changes in a depth A2 of the pattern 135 and a width B2 at the entrance side thereof defined while increasing the time of the second etching process to 60 seconds (s), 120 s, 180 s, 240 s, 270 s, and 300 s, the width B2 gradually increases, but the depth A2 gradually decreases. The reason why the depth A2 is decreased is that the thickness of the substrate 100 at a side without the pattern is also decreased. In addition, it may be seen that a dimensional ratio A2/B2 of the depth A2 to the width B2 also becomes smaller. That is, it may be seen that as the time of the second etching process is longer, the width of the finally defined pattern 135 becomes larger and has a more round shape.

Figure 12:
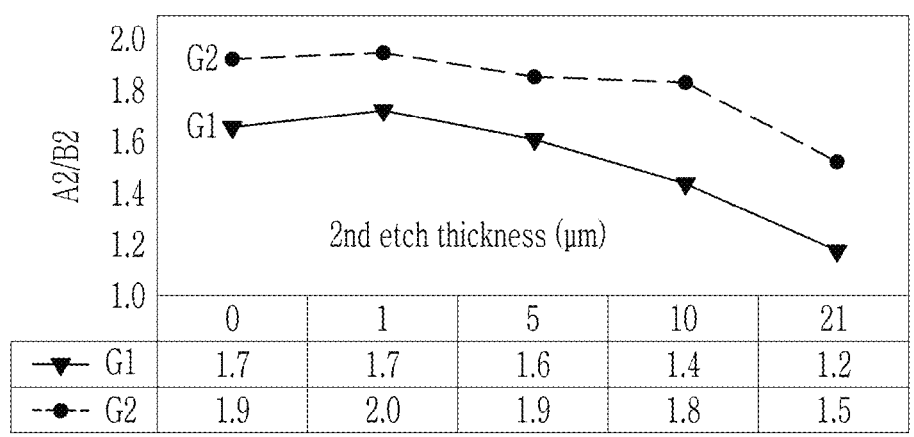
FIG. 12 illustrates a graph showing an embodiment of a dimension ratio of a pattern depending on an etching amount in a second etching operation during a process of a method for patterning a substrate of a display device.
Figure 13:
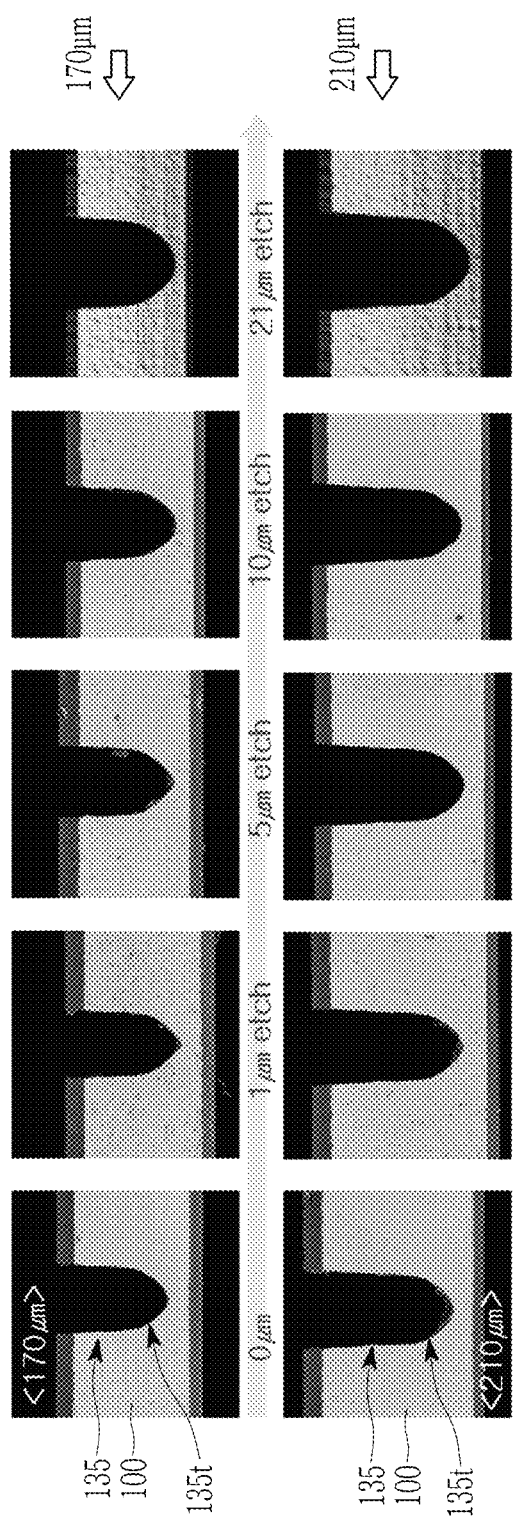
FIG. 13 illustrates a photograph showing a cross-sectional shape of an example of a pattern depending on an etching amount in a second etching operation during a process of a method for patterning a substrate of a display device.
Figure 14:
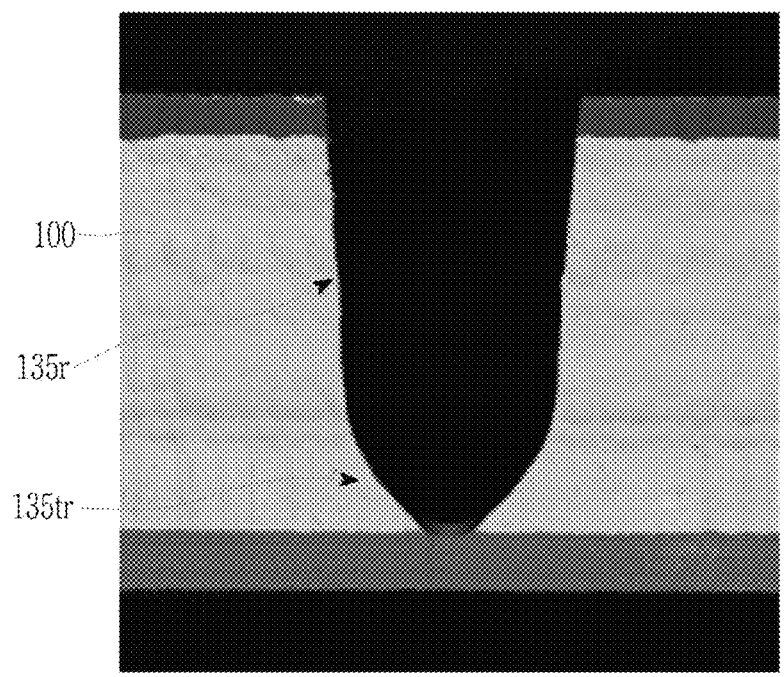
FIG. 14 illustrates a photograph showing a cross-sectional shape of a comparative example of a pattern of a substrate.

FIG. 12 illustrates a graph showing an embodiment of a dimension ratio of a pattern depending on an etching amount (or an etching time) in a second etching step during a process of a method for patterning a substrate of a display device, FIG. 13 illustrates a photograph showing a cross-sectional shape of an example of a pattern depending on an etching amount in a second etching step in a process of a method for patterning a substrate of a display device, and FIG. 14 illustrates a photograph showing a cross-sectional shape of a comparative example of a pattern of a substrate.

The graph G1 of FIG. 12 and an upper row of FIG. 13 show an example in which the thickness of the substrate 100 after the first etching process is about 170 μm, and the graph G2 of FIG. 12 and a lower row of FIG. 13 show an example in which the thickness of the substrate 100 after the first etching process is about 210 μm.

FIG. 14 illustrates a photograph of the pattern 135r after etching about 21 μm based on one surface of a substrate 100r by adding an etching process using sodium hydroxide (NaOH) instead of the second etching process, unlike in FIG. 12 and FIG. 13, even when the thickness of the substrate 100 after the same first etching process as in FIG. 12 and FIG. 13 is about 200 μm.

Referring to FIG. 12, it may be seen that the dimensional ratio A2/B2 of the depth A2 to the width B2 of the pattern 135 defined by increasing a second etch thickness on one surface of the substrate 100 from about 0 μm to about 1 μm, about 5 μm, about 10 μm, and about 21 μm in the second etching process gradually decreases in both of the graphs G1 and G2. A characteristic of the shape of the actually defined pattern 135 may be checked in FIG. 13.

As illustrated in FIG. 13, it may be seen that as the etch thickness of the second etching process increases, and the width of the pattern 135 gradually increases, and the shape of the end portion 135t of the pattern 135 is gradually changed to a more round shape. Particularly, it may be seen that compared to the end portion 135tr of the pattern 135r according to the comparative embodiment of FIG. 14, the end portion 135t of the pattern 135 finally defined in the embodiment of FIG. 13 in the illustrated embodiment (after etching of about 21 μm) has a shape that is closer to the end portion 115t of the pattern 115 depending on the design illustrated in FIG. 2 or FIG. 3 described above. This will be described with reference to FIG. 15 to FIG. 17.

Figure 15:
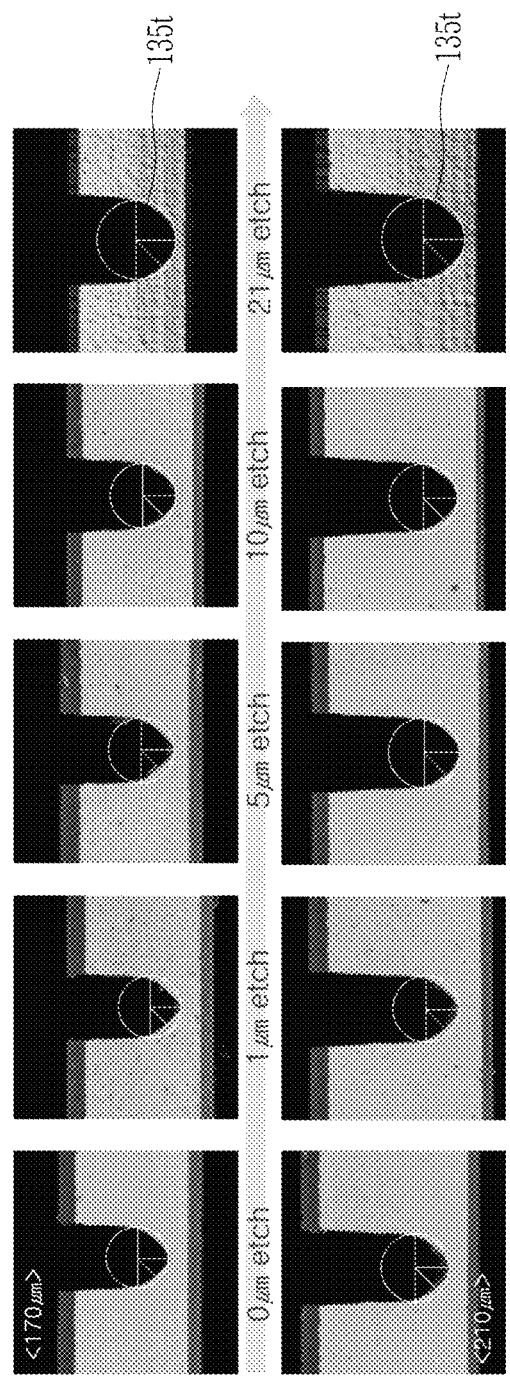
FIG. 15 illustrates a photograph showing a cross-sectional shape of an embodiment of a pattern depending on an etching amount in a second etching operation during a process of a method for patterning a substrate of a display device.
Figure 16:
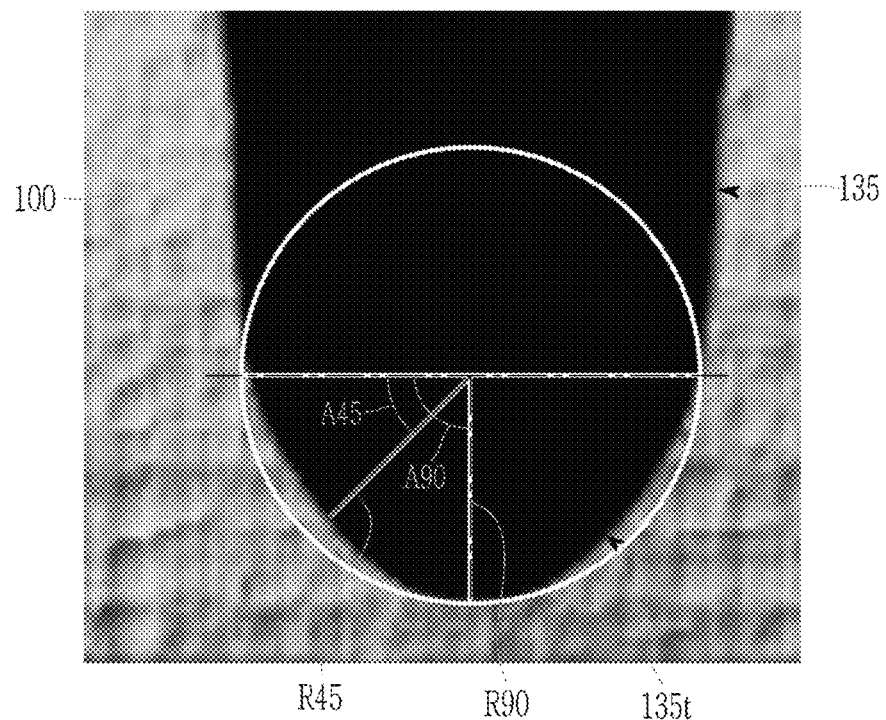
FIG. 16 illustrates an embodiment of a shape of a pattern of a substrate of a display device.
Figure 17:
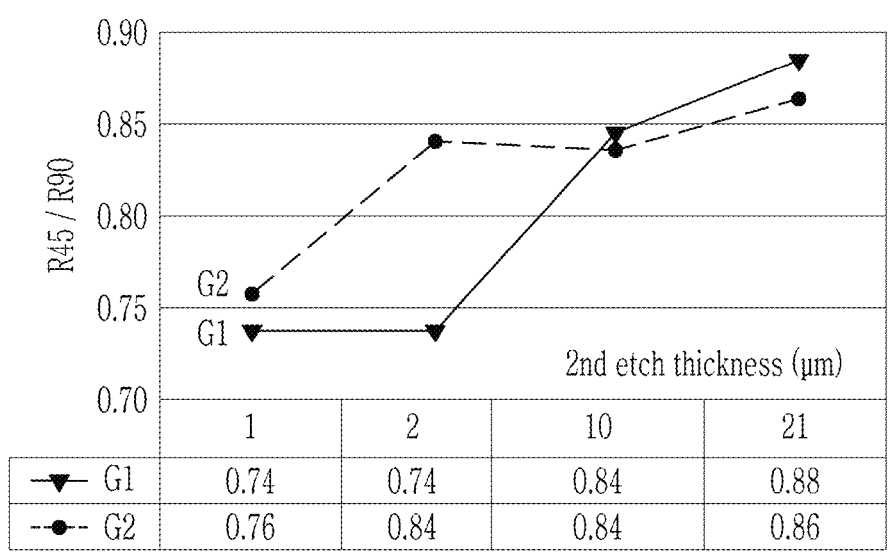
FIG. 17 illustrates a graph showing an embodiment of a change in a ratio of an inner radius of a pattern depending on an etching amount in a second etching operation during a process of a method for patterning a substrate of a display device.

FIG. 15 illustrates a photograph showing a cross-sectional shape of an embodiment of a pattern depending on an etching amount (or an etching time) in a second etching step in a process of a method for patterning a substrate of a display device, FIG. 16 illustrates an embodiment of a shape of a pattern of a substrate of a display device, and FIG. 17 illustrates a graph showing a change in a ratio of an inner radius of a pattern depending on an embodiment of an etching amount in a second etching step during a process of a method for patterning a substrate of a display device.

FIG. 15 illustrates a circle including two radii at the end portion 135t of the pattern 135 in the photograph of FIG. 13 described above, and FIG. 16 illustrates an enlarged view of the pattern 135 defined when the second etch thickness is about 21 μm and the circle illustrated therewith.

Referring to FIG. 15 and FIG. 16, it may be seen that as the second etch thickness (or etching time) increases, the end portion 135t of the pattern 135 becomes closer to a circular shape. Referring to FIG. 16, an inner radius R90 to a surface of a pattern in which an angle A90 from a reference line OL and positioned above the end portion 135t of the pattern 135 and parallel to the first surface 110a or the second surface 110b of the substrate 100 defines approximately 90 degrees is substantially the same as an inner radius R45 from the reference line OL to a surface of a pattern at which an angle A45 is approximately 45 degrees. This change in the shape of the end portion 135t may also be seen in FIG. 17.

The graph G1 of FIG. 17 shows an example in which the thickness of the substrate 100 after the first etching process is about 170 μm, and the graph G2 shows an example in which the thickness of the substrate 100 after the first etching process is about 210 μm.

Referring to FIG. 17, a ratio of the inner radius R45 to the inner radius R90 as shown in FIG. 16 of the end portion 135t of the pattern 135 defined as the etch thickness increases to about 1 μm, about 2 μm, about 10 μm, or about 21 μm in the second etching process usually increases and approaches 1. That is, it may be seen that as the second etching process is performed for more time, the end portion 135t of the pattern 135 has a more round shape close to an initial design.

In particular, in the illustrated embodiment, the second etching process may be performed for 1 min or more, and the ratio of the inner radius R45 to the inner radius R90 of the end portion 135t of the pattern 135 may be about 0.7 or more, as illustrated in FIG. 17.

As described above, a depth, width, and shape of the end portion 135t of the pattern 135 may be precisely controlled to be close to the design through the second etching process after the first etching process. When the end portion 135t of the pattern 135 has a sharp portion instead of a round one as in the previous comparative example, stress may be generated during bending of the substrate, thereby allowing cracks to occur in the substrate. However, in the embodiment of the invention, since the end portion 135t of the pattern 135 is precisely defined as designed to have a round shape, bending strength may be increased.

When only the first etching process is performed, high temperature and long etching time are desired due to a characteristic of an alkali-based etchant in order to define a pattern of a desired depth, and vapor of the etchant is generated, making it difficult to control a concentration of the etchant. However, in the second etching process in the illustrated embodiment, only a short time is desired at room temperature, and an acid-based etchant is relatively easy to manage, so it is easy to control the patterning process. In addition, since the entire patterning time may be shortened, the patterning process may be quickly and economically performed compared to a case where only the first etching process using only an alkali-based etchant is performed.

Figure 18:
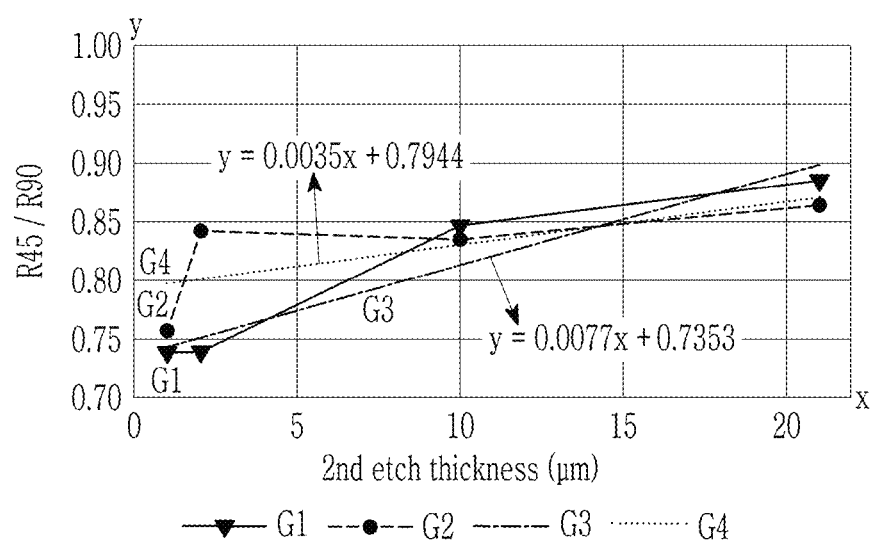
FIG. 18 illustrates a graph showing an embodiment of a change in a ratio of an inner radius of a pattern depending on an etching amount in a second etching operation during a process of a method for patterning a substrate of a display device, and a graph of a linear function approximate thereto.

FIG. 18 illustrates a graph (G1 and G2) showing an embodiment of a change in a ratio of an inner radius of a pattern depending on an etching amount in a second etching step during a process of a method for patterning a substrate of a display device, and a graph (G3 and G4) of a linear function approximate thereto. The graph G1 of FIG. 18 shows an example in which the thickness of the substrate 100 after the first etching process is about 170 μm, and the graph G2 shows an example in which the thickness of the substrate 100 after the first etching process is about 210 μm.

Referring to FIG. 18, the etch thickness of the second etching process for defining the pattern 135 having a desired shape may be reverse engineered by a graph of a change in the end portion 135t of the pattern depending on the etch thickness of the second etching process.

As the etch thickness increases from about 0 μm to about 5 μm, about 10 μm, about 15 μm, and about 20 μm in the second etching process, a ratio of the inner radius R45 to the inner radius R90 illustrated in FIG. 16 of the tip 135t of the pattern 135 generally increases, and when the two graphs G1 and G2 are approximated by a linear function expression, they may be approximated to the linear function graphs G3 and G4 as shown in FIG. 18.

Linear function formulas of the two graphs G3 and G4 are, e.g., y=0.0035x+0.7944 and y=0.0077x+0.7353, respectively. Herein, the variable x represents the etch thickness in the second etching process, and the variable y represents the ratio of the inner radius R45 to the inner radius R90 of the end portion 135t of the pattern 135.

When the ratio of the inner radius R45 to the inner radius R90 of the end portion 135t of the pattern 135 is desired to be 1, x is 35 in the functional formula of the graph G3, which is an embodiment in which the thickness of the substrate after the first etching process is approximately 170 μm, and thus it may be designed to perform etching to approximately 35 μm based on one surface of the substrate in the second etching process.

When the ratio of the inner radius R45 to the inner radius R90 of the end portion 135t of the pattern 135 is desired to be 1, x is 59 in the functional formula of the graph G4, which is an embodiment in which the thickness of the substrate after the first etching process is approximately 210 μm, and thus it may be designed to perform etching to approximately 59 μm based on one surface of the substrate in the second etching process.

When the linear function formula of the ratio y of the inner radius R45 to the inner radius R90 of the end portion 135t of the pattern 135 with respect to the etch thickness x in the second etching process is expressed as y=Ax+B, "A" may vary depending on the thickness of the substrate after the first etching process and an etching rate of the second etching process, and may be 0<A≤0.01, for example, and "B" may be the ratio of the inner radius R45 to the inner radius R90 of the end portion 135t as close to a circular shape of the end portion 135t of the pattern 135 after only the first etching process is performed, and may be 0.5≤B<1, for example.

Figure 19:
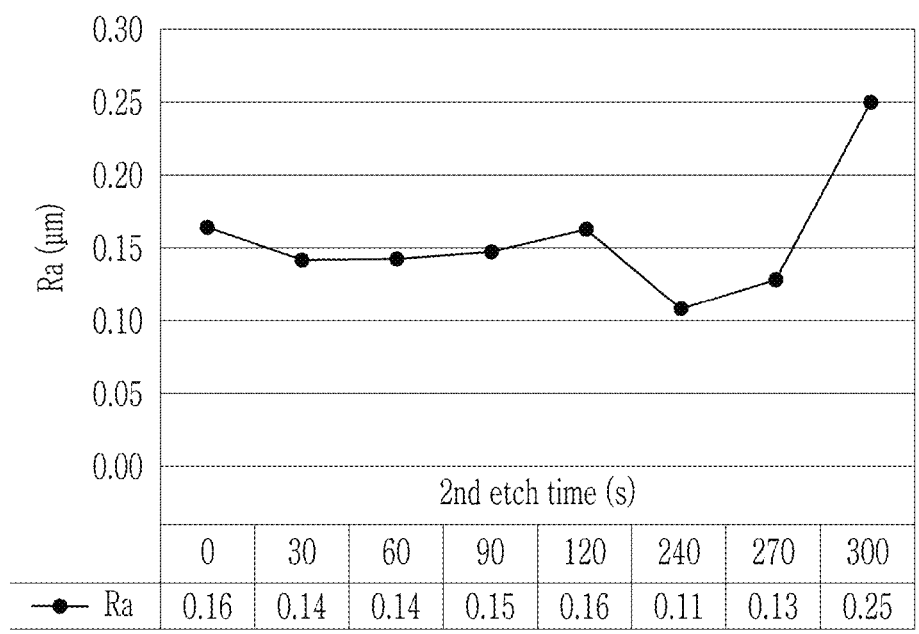
FIG. 19 illustrates a graph showing an embodiment of roughness of an upper surface of a pattern depending on an etching amount in a second etching operation during a process of a method for patterning a substrate of a display device.

FIG. 19 illustrates a graph showing an embodiment of roughness Ra of an upper surface of a pattern depending on an etching amount in a second etching operation in a process of a method for patterning a substrate of a display device.

As described above, after laser irradiation depending on the patterning method in an embodiment of the invent, the pattern 135 of the substrate formed or provided through the anisotropic first etching process and the isotropic second etching process has a longer shape in a cross-sectional direction of the substrate 100 due to the first etching process as illustrated in FIG. 10 or the like, and the end portion 135t has a round shape due to the second etching process.

In addition, as illustrated in FIG. 19, when the secondary etching process in the illustrated embodiment is performed, the roughness Ra of an upper surface of the pattern 135 generally increases as a second etching time increases. That is, compared to the upper surface of the pattern 125 after only the first etching process, the upper surface of the pattern 135 after the second etching process has a rougher surface.

Figure 20:
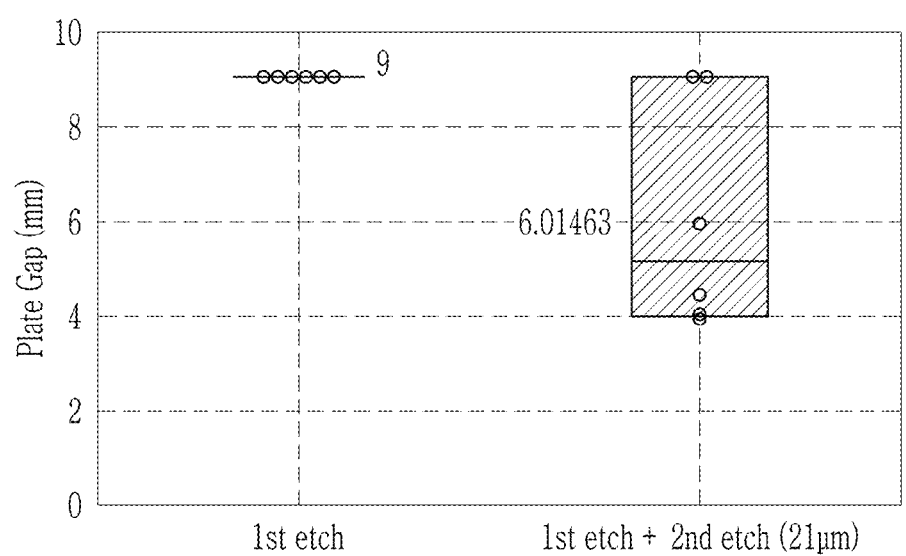
FIG. 20 illustrates a graph comparing bending strength of a substrate when only first etching is performed and when second etching is also performed during an embodiment of a process of a method for patterning the substrate of a display device.

FIG. 20 illustrates a graph comparing bending strength of a substrate when only first etching is performed and when second etching is performed during an embodiment of a process of a method for patterning the substrate of a display device.

In the illustrated embodiment, after folding a substrate, positioning plates at opposite sides, and reducing a plate gap between the two plates, gap between the two plates of the substrate to be broken is measured in order to measure bending strength of the substrate.

Referring to FIG. 20, in the case of a substrate that had only undergone the first etching process, the substrate was damaged when the gap between the two plates was approximately 9 millimeters (mm). However, it may be seen that when the second etching process is also performed after the first etching process as in the illustrated embodiment (when the etch thickness of the second etching process is about 21 μm), the gap between the two plates at which the substrate is damaged is smaller than 9 mm, an average value is approximately 6.01463.

That is, depending on the patterning method in the illustrated embodiment, the substrate 100 on which the pattern 135 is defined through the anisotropic first etching process and the isotropic second etching process after laser irradiation for reforming may have stronger bending strength.

In the display device including the substrate 100 in the illustrated embodiment, an inside of the pattern 135 of the substrate 100 may be filled with one or more materials. In an embodiment, the inside of the pattern 135 may be filled with at least one of a resin such as an acrylate-based resin, a urethane acrylate-based resin, or a silicone-based resin, for example.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A patterning method comprising:
forming a reformed region on a substrate by irradiating a laser on a first surface of the substrate;
defining a first pattern corresponding to the reformed region by first etching the substrate; and
defining a second pattern which is further etched from the first pattern by second etching the substrate,
wherein the first etching is performed by an alkali-based etchant, and the second etching is performed by an acid-based etchant.

2. The patterning method of claim 1, wherein
a chemical characteristic of the substrate is changed and no physical damage occurs in the reformed region.

3. The patterning method of claim 1, wherein
the alkali-based etchant includes sodium hydroxide or potassium hydroxide, and
the acid-based etchant includes hydrofluoric acid.

4. The patterning method of claim 1, wherein
when a ratio of a thickness which is etched from a side of the first surface of the substrate in a region where the first pattern is defined to a thickness which is etched from a side of the first surface of the substrate in a region where the first pattern is not defined is referred to as first selectivity in the first etching, and when a ratio of a thickness which is etched from a side of the first surface of the substrate in a region where the second pattern is defined to a thickness which is etched from a side of the first surface of the substrate in a region where the second pattern is not defined is referred to as second selectivity in the second etching, the second selectivity is smaller than the first selectivity.

5. The patterning method of claim 1, wherein
a depth of the first pattern is longer than a width of the first pattern at an entrance side of the first pattern.

6. The patterning method of claim 5, wherein
a ratio of the depth to the width of the first pattern at the entrance side of the first pattern is greater than a ratio of a depth to a width of the second pattern at an entrance side of the second pattern.

7. The patterning method of claim 6, wherein
the width of the second pattern at the entrance side of the second pattern gradually increases with a time during which the second etching is performed, and the ratio of the depth of the second pattern to the width of the second pattern at the entrance side of the second pattern gradually decreases.

8. The patterning method of claim 6, wherein,
the second pattern includes an end portion, and
when an inner radius from a reference line positioned above the end portion and parallel with the first surface of the substrate to a surface of the second pattern defining about 90 degrees is referred to as a first inner radius and an inner radius from the reference line to the surface of the second pattern defining about 45 degrees is a second inner radius,
a ratio of the second inner radius to the first inner radius increases as an etching amount of the second etching increases.

9. The patterning method of claim 1, wherein
a roughness of a surface of the second pattern is greater than a roughness of a surface of the first pattern.

10. The patterning method of claim 1, wherein
a bending strength of the substrate including the second pattern is greater than a bending strength of the substrate including the first pattern.

11. A patterning method comprising:
forming a reformed region on a substrate by irradiating a laser on a first surface of the substrate;
defining a first pattern corresponding to the reformed region by first etching the substrate; and
defining a second pattern which is further etched from the first pattern by second etching the substrate,
wherein the second etching is more isotropic than the first etching.

12. The patterning method of claim 11, wherein
a chemical characteristic of the substrate is changed and no physical damage occurs in the reformed region.

13. The patterning method of claim 11, wherein
the first etching is performed by an alkaline etchant, and the second etching is performed by an acid-based etchant.

14. The patterning method of claim 11, wherein
when a ratio of a thickness which is etched from a side of the first surface of the substrate in a region where the first pattern is defined to a thickness which is etched from a side of the first surface of the substrate in a region where the first pattern is not defined is referred to as a first selectivity in the first etching, and when a ratio of a thickness which is etched from a side of the first surface of the substrate in a region where the second pattern is defined to a thickness which is etched from a side of the first surface of the substrate in a region where the second pattern is not defined is referred to as a second selectivity in the second etching, the second selectivity is smaller than the first selectivity.

15. The patterning method of claim 11, wherein
a depth of the first pattern is longer than a width of the first pattern at an entrance side of the first pattern.

16. The patterning method of claim 15, wherein
a ratio of the depth to the width of the first pattern at the entrance side of the first pattern is greater than a ratio of a depth to a width of the second pattern at an entrance side of the second pattern.

* * * * *